United States Patent [19]

Marr

[11] Patent Number: 5,745,415

[45] Date of Patent: Apr. 28, 1998

[54] CIRCUIT FOR SRAM TEST MODE ISOLATED BITLINE MODULATION

[75] Inventor: Kenneth W. Marr, Boise, Id.

[73] Assignee: Micron Technology, Inc., Boise, Id.

[21] Appl. No.: 734,064

[22] Filed: Oct. 18, 1996

Related U.S. Application Data

[63] Continuation of Ser. No. 421,506, Apr. 12, 1995, Pat. No. 5,568,435.

[51] Int. Cl.[6] .................................................. G11C 7/00
[52] U.S. Cl. .................................... 365/201; 365/154
[58] Field of Search ................................ 365/201, 154, 365/156, 226

[56] References Cited

U.S. PATENT DOCUMENTS

| | | | |
|---|---|---|---|
| 4,901,284 | 2/1990 | Ochii | 365/154 |
| 5,208,777 | 5/1993 | Shibata | 365/201 |
| 5,212,442 | 5/1993 | O'Toole | 365/201 |
| 5,222,066 | 6/1993 | Grula et al. | 371/21.1 |
| 5,255,230 | 10/1993 | Chan et al. | 365/201 |
| 5,305,267 | 4/1994 | Haraguchi et al. | 365/201 |
| 5,481,373 | 1/1996 | Ohsawa | 365/201 |
| 5,644,542 | 7/1997 | McClure | 365/201 |

*Primary Examiner*—A. Zarabian
*Attorney, Agent, or Firm*—Trask, Britt & Rossa

[57] ABSTRACT

A circuit and method provide isolated modulation of SRAM bitline voltage levels for improved voltage bump retention testing of the SRAM cells. A first FET is connected to Vcc, bitline load gates of the SRAM cell, and test mode operation control logic. A second FET is connected to the bitline load gates, the test mode logic, and an external pin of the SRAM device. During test mode operation, the first FET disables Vcc to the bitlines, and the second FET enables the internal bitline voltage levels to be modulated by a voltage supply received through the external pin of the device. Modulation of the bitline voltage levels is isolated from normal operating voltage levels of peripheral circuitry such as the wordlines. An alternate embodiment provides a CMOS transmission gate in place of the second FET.

19 Claims, 2 Drawing Sheets

CIRCUIT FOR SRAM TEST MODE ISOLATED BITLINE MODULATION

This is a continuation of application Ser. No. 08/421,506, filed Apr. 12, 1995, now U.S. Pat. No. 5,568,435.

TECHNICAL FIELD

This invention relates to semiconductor memory technology and, more specifically, to a circuit and method for testing static random access memory (SRAM) using bitline level modulation.

BACKGROUND OF THE INVENTION

SRAM memory arrays use more n-channel (NMOS) field effect transistors (FETs) than conventional dynamic random access memory (DRAM) arrays and are thus capable of storing data without the need to constantly refresh the memory cells as is required in DRAM technology. However, the cross-coupled nature of the SRAM cell allows manufacturing defects to exist within the cell and not necessarily cause the cell to improperly function within the normal operating range when it is first tested, but which may cause it to fail later.

Semiconductor devices in general are commonly subjected to a series of test procedures in order to assure product quality and reliability. Product reliability is a product's ability to function over time within given performance limits under specified operational conditions. These testing procedures conventionally include probe testing, in which an individual die, while still on a wafer, is initially tested to determine functionality and possibly speed. If the wafer has a yield of functional dice which indicates that the quality of the functional dice is likely to be good, each individual die is assembled in a package. Conventionally, the packaging includes mounting the die on a lead frame and encapsulating it in a plastic housing with external leads for electrical connection purposes.

The packaged devices are then subjected to another series of accelerated life testing, which includes burn-in and discrete functional testing. Burn-in detects and weeds out infant mortality failures by exercising the devices and subjecting them to temperature and voltage stresses. Infant mortality refers to those devices that would fail early in their lives due to manufacturing defects. Burn-in accelerates device failure by electrically exercising the devices at elevated temperatures in a burn-in oven adapted for that purpose. Functional testing permits the devices to be tested for speed and for errors which may occur after assembly and after burn-in.

Functional tests can include low and high Vcc margin and bump retention tests. In a bump retention test, for example, voltage is dropped down to a predetermined low level during a read to detect whether the memory device will read correctly or whether it will unacceptably change its memory state. The ability of a cell to retain its data (and not change states) when being read is known as its static noise margin (SNM). Defective cells have a lower SNM than good cells. In other words, the more SNM the cell has, the less likely it is to change states during a read.

Although normal acceptable working voltage levels for a five (5) volt SRAM device may be in the range of 4.5 to 5.5 volts, a bump retention test may drop the voltage down to as low as 2.2 volts to test the extreme functional limits of the device. If the device retains its data and reads properly during the low voltage test state, it is deemed a functional device. On the other hand, if a memory cell (or cells) in the device unacceptably changes states, the device fails the test and is discarded.

Alternatively, instead of using a predetermined low voltage, a more complete voltage search test may be performed wherein various low voltage levels are applied incrementally to determine what the functional voltage limits of the array of cells is. This test is often used to determine a point of full array failure, meaning the voltage level at which most, if not all, of the cells unacceptably change states. However, this test is time consuming and costly and so is performed only when deemed cost effective.

Bump retention tests can be performed either at wafer sort or in packaged part testing. Although this type of testing screens out most defective SRAM cells, it retains certain inherent limitations. For example, it is known that some defective cells are not detected during a low voltage bump retention read test due to, possibly, the reaction of peripheral circuitry characteristics in the SRAM device during the low voltage portion of the test. Essentially, when extreme low or high voltages are applied to an SRAM device for specific test purposes, all circuitry in the device is subject to the same test voltage level without any isolating effects for peripheral circuitry. The problem associated with all circuitry being subject to the same test voltage level is that certain peripheral circuitry (for example, wordlines) should selectively retain a normal acceptable voltage level (different from the test voltage level) for improved testing conditions and to better isolate defective aspects of the cells.

Accordingly, objects of the present invention are to provide a circuit and method for isolating test voltages for improved functional testing of SRAM devices.

SUMMARY OF THE INVENTION

According to principles of the present invention in its preferred embodiment, a test mode circuit and method provide for isolated, external modulation of SRAM bitline levels for improved voltage bump retention testing of the SRAM cells. A first FET is connected to Vcc, bitline load gates of the SRAM cell, and test mode control logic. A second FET is connected to the bitline load gates, the test mode logic, and an external pin of the SRAM device. During test mode operation, the first FET disables Vcc to the bitline load gates, and the second FET enables a voltage received from the external pin to be applied to the bitline load gates to modulate bitline voltage levels while retaining a normal operating voltage level applied to peripheral circuitry of the SRAM.

According to further principles of the present invention, an alternate embodiment provides a CMOS transmission gate in place of the second FET, and the test mode control logic is modified accordingly.

Advantages of the present invention are that it provides an improved means for detecting the low voltage level of a full array failure for a more reliable screen of defective SRAM devices. A further advantage includes faster low voltage read testing cycle time since the periphery wordline supply voltage is isolated from the externally modulated bitline voltage while in test mode.

Other objects, advantages, and capabilities of the present invention will become more apparent as the description proceeds.

DETAILED DESCRIPTION OF THE INVENTION

Figure 1:
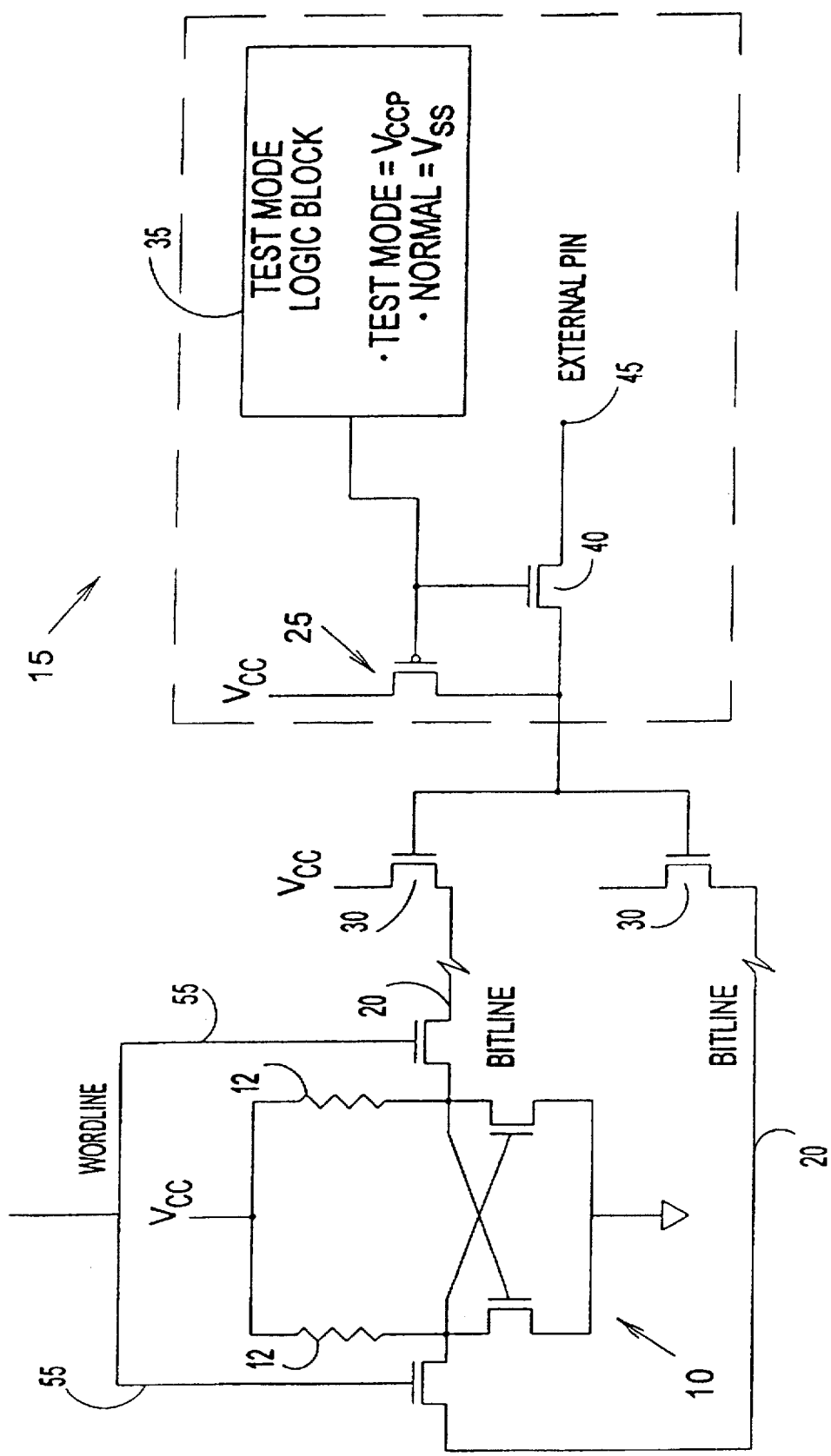
FIG. 1 is a schematic of the present invention circuit connected to a conventional SRAM cell for external modulation of internal bitlines during test mode of the cell.

FIG. 1 is a schematic of the present invention circuit 15 connected to a conventional SRAM cell 10 for external modulation of internal bitlines 20 during test mode of the cell. Although SRAM cell 10 is shown having resistor loads 12, the present invention is equally applicable to all SRAM cell architectures, such as those having a p-channel load or a thin film transistor (TFT) load, for example. Furthermore, where electrical functions and connections are described in this disclosure, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is, therefore, intended to include components which are in electrical communication despite intervening components.

In the preferred embodiment, one active area of p-channel FET 25 is connected to bitline load gates 30, and the other active area is connected to Vcc. The gate of FET 25 is connected to test mode control logic circuitry 35. Similarly, the gate of FET 40 is connected to test mode logic 35, and one active area of n-channel FET 40 is connected to bitline load gates 30. However, the other active area of FET 40 is connected to an external pin 45 (terminal or bonding pad) of the device, rather than to Vcc, for providing external voltage modulation through FET 40 to bitline load gates 30.

Test mode control logic 35 provides a test mode operation control signal (bitline isolation mode control signal) for memory device 10. Specifically, during normal operation of SRAM cell 10, test mode logic block 35 sends a normal operation control ground signal Vss to the gate of p-channel FET 25 to retain FET 25 in an "ON" state thereby allowing Vcc to pass through FET 25 and operate bitline load gates 30. Also during this normal operating state, the gate of nchannel FET 40 likewise receives the Vss signal but is retained in an "OFF" state to disallow any externally applied voltage at terminal 45 to pass through FET 40. In this normal operating condition, the voltage levels for bitlines 20 is calculated as Vcc-Vt where Vt is the threshold voltage of bitline load transistors 30. FETs 25 and 40 are referred to as enabling circuitry for selectively enabling a voltage signal to the bitline load gates 30.

In contrast, during test mode operation, logic block 35 sends a test mode (isolation) operation control signal Vccp to FETs 25 and 40. Vccp is some voltage signal greater than Vcc which may be produced by Vcc pump logic circuitry contained on the SRAM device, or may be passed in through an external pin. The manner in which test mode logic circuitry 35 is implemented or enabled is not particularly germane to this invention except that it must produce signals to operate FETs 25 and 40 so that external modulation of bitlines 20 occurs from external pin 45.

When test mode logic 35 sends the Vccp signal, p-channel FET 25 is turned "OFF" to disable the Vcc voltage to bitline load gates 30, and n-channel FET 40 is turned "ON" to enable an external test voltage (Ve) applied at terminal 45 to pass through FET 40 to bitline load gates 30. In this test mode condition, the voltage levels for bitlines 30 is calculated as Ve-Vt. As the bitline levels drop in response to the reduced test voltage Ve, the SNM of cell 10 decreases and allows for detection of a defective cell. However, the present invention isolates this drop in bitline levels from the peripheral circuitry of cell 10 for improved SRAM testing. Namely, although Ve (a second voltage signal relative to a first voltage signal Vcc) is applied at terminal 45 and at the gates of bitline loads 30 (first circuitry) to modulate bitlines 20, the Vcc signal remains selectively connected to second (peripheral) circuitry such as the active areas of bitline loads 30, pull up resistors 12, and wordlines 55. In this context, Ve is isolated (as applied to load gates 30 for bitlines 20) relative to Vcc (as applied to the peripheral circuitry).

The advantages of the present invention in isolating the bitline voltage level from the peripheral circuitry voltage level is that (1) it allows a lower test voltage to be applied to the bitlines while retaining completely functional peripheral circuitry for reliable test conditions; (2) the point of full array failure is better detected because a lower voltage search limit can be applied to the bitlines while retaining functionally isolated wordlines; and (3) testing occurs at a much faster cycle time (cell addressing) because the periphery (wordline) supply voltage is isolated from the bitline voltage.

Figure 2:
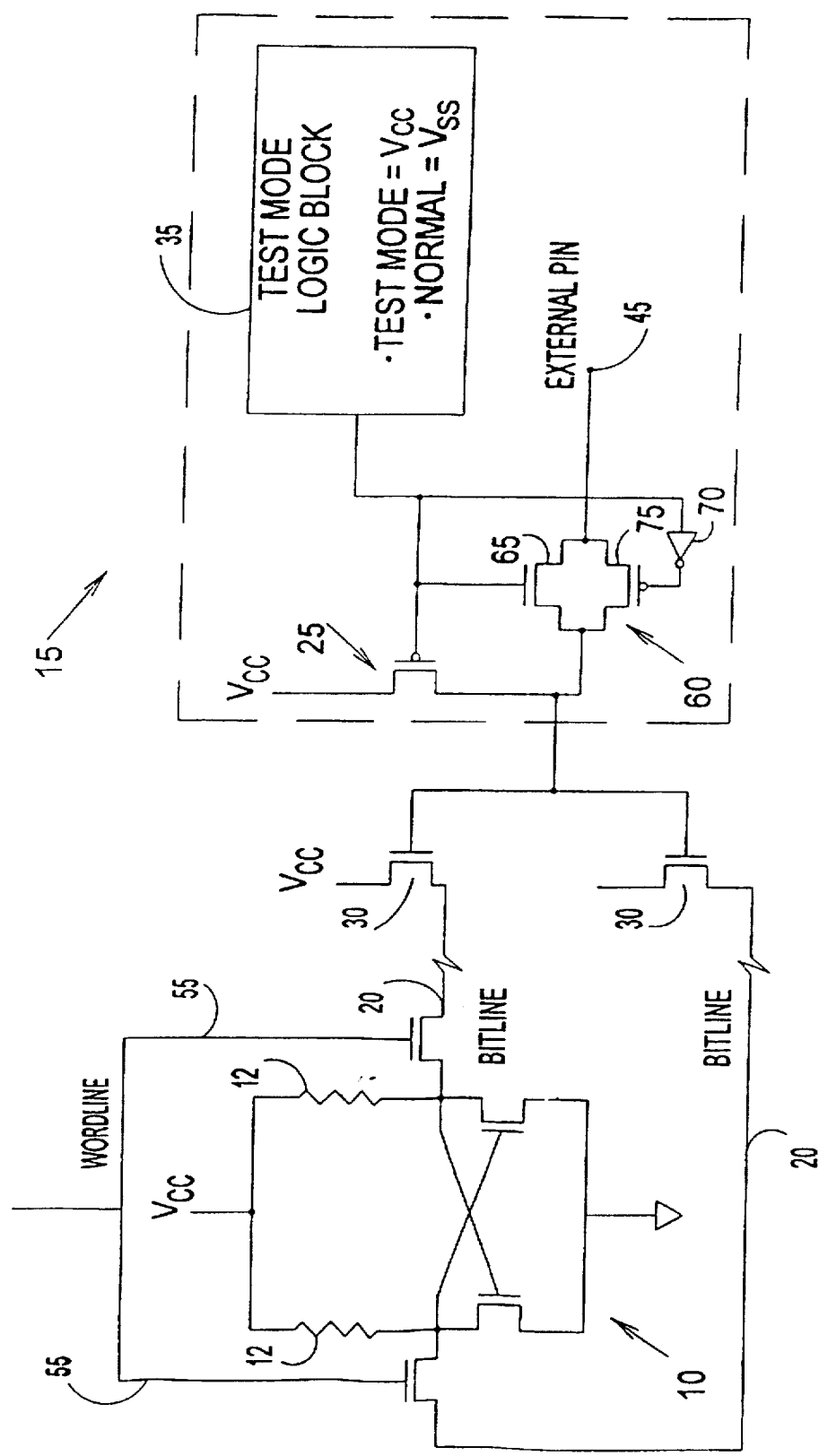
FIG. 2 is an alternate embodiment of the present invention.

Referring now to FIG. 2, an alternate embodiment of the present invention is shown. Although the general principle of externally modulating bitlines 20 remains the same, this embodiment provides some noted distinctions. Particularly, a complementary metal oxide semiconductor (CMOS) transmission gate 60 is used instead of an NMOS pass gate (FET 40 of FIG. 1), and logic block 35 sends a Vcc test mode signal rather than a Vccp signal. The gate of n-channel device 65 of CMOS gate 60 is connected to logic block 35. Furthermore, inverter 70 is connected between logic block 35 and the gate of p-channel device 75 of CMOS gate 60.

This embodiment provides an advantage in that no voltage pump is required to produce a Vccp signal (as in FIG. 1), thus less die space is used. However, this embodiment cannot be used on, for example, a 3.3 volt part that has 5 volt compatible Input/Outputs due to the issue of forward-bias of the p+ nwell diode on p-channel device 75 of CMOS transmission gate 60.

The resulting function of this embodiment is similar to that of FIG. 1. Namely, during normal operation of SRAM cell 10, test mode logic block 35 sends a ground signal Vss to the gate of p-channel FET 25 to retain FET 25 in an "ON" state, thereby enabling Vcc to pass through FET 25 and operate bitline load gates 30. The gate of n-channel device 65 also receives the Vss control mode signal, and the gate of p-channel device 75 receives an inverted signal through inverter 70 so that CMOS transmission gate 60 is retained in an "OFF" state to disable the pass through of any externally applied voltage at terminal 45.

During test mode operation, logic block 35 sends a test mode signal Vcc (not Vccp) to FETs 25 and 65, and FET 75 receives an inverted Vcc signal. When test mode logic 35 sends the Vcc signal, p-channel FET 25 is turned "OFF" to disable the Vcc voltage to bitline load gates 30, and FETs 65 and 75 are turned "ON" to allow an external test voltage (Ve) applied at terminal 45 to pass through CMOS gate 60 to bitline load gates 30. As the bitline voltage levels drop in response to the reduced test voltage Ve, the SNM of cell 10 decreases. However, since the bitline voltage level drop is isolated from the Vcc selectively applied to the peripheral circuitry of cell 10, such as at wordlines 55, read testing for a defective cell is enhanced. What has been described above are the preferred embodiments for a circuit and method to provide isolation and external modulation of bitline levels for improved voltage bump retention testing of SRAM cells. It is clear that the present invention provides a powerful tool for improving SRAM device testing and reliability. While the present invention has been described by reference to specific embodiments, it will be apparent that other alternative embodiments and methods of implementation or modification may be employed without departing from the true spirit and scope of the invention.

What is claimed is:

1. A circuit in a memory device for selectively applying a test mode voltage and a supply voltage to gates of bitline load devices in the memory device while the supply voltage is applied to peripheral circuitry in the memory device, the circuit comprising:

circuitry for isolating the supply voltage from the gates of the bitline load devices and for applying the test mode voltage to the gates of the bitline load devices while the supply voltage is applied to the peripheral circuitry; and circuitry for isolating the test mode voltage from the gates of the bitline load devices and for applying the supply voltage to the gates of the bitline load devices while the supply voltage remains applied to the peripheral circuitry.

2. The circuit of claim 1 wherein the memory device comprises a static random access memory (SRAM).

3. A semiconductor memory device comprising:

a plurality of memory cells;

peripheral circuitry coupled to the memory cells and operative in response to receiving a supply voltage in both a normal mode and a test mode of the memory device;

a plurality of bitlines coupled to the memory cells; and switching circuitry coupled to the bitlines for selectively outputting a normal bitline voltage thereto in the normal mode of the memory device and for selectively outputting an analog test mode bitline voltage thereto that is different than the normal bitline voltage and the supply voltage in the test mode of the memory device while the peripheral circuitry receives the supply voltage.

4. The semiconductor memory device of claim 3 wherein the memory cells comprise Static Random Access Memory (SRAM) memory cells.

5. The semiconductor memory device of claim 3 wherein the peripheral circuitry includes wordlines.

6. The semiconductor memory device of claim 3 wherein the switching circuitry includes a plurality of NMOS bitline load transistors each having a drain for receiving the supply voltage and a source coupled to one of the bitlines for selectively outputting the normal bitline voltage thereto in the normal mode of the memory device.

7. The semiconductor memory device of claim 6 wherein the switching circuitry also includes a PMOS transistor having a source for receiving the supply voltage, a gate for receiving a test mode enable signal, and a drain coupled to gates of the NMOS bitline load transistors for selectively outputting the supply voltage thereto in response to the test mode enable signal being inactive in the normal mode of the memory device.

8. The semiconductor memory device of claim 6 wherein the switching circuitry also includes an NMOS switching transistor having a drain for receiving an analog test mode voltage, a gate for receiving a test mode enable signal, and a source coupled to gates of the NMOS bitline load transistors for selectively outputting the test mode voltage thereto in response to the test mode enable signal being active in the test mode of the memory device.

9. The semiconductor memory device of claim 8 further comprising a pin external to the memory device coupled to the drain of the NMOS switching transistor for providing the test mode voltage thereto.

10. The semiconductor memory device of claim 6 wherein the switching circuitry also includes a CMOS transmission gate having an input terminal for receiving an analog test mode voltage, a control terminal for receiving a test mode enable signal, and an output terminal coupled to gates of the NMOS bitline load transistors for selectively outputting the test mode voltage thereto in response to the test mode enable signal being active in the test mode of the memory device.

11. The semiconductor memory device of claim 10 further comprising a pin external to the memory device coupled to the input terminal of the CMOS transmission gate for providing the test mode voltage thereto.

12. The semiconductor memory device of claim 3 further comprising a test mode logic block.

13. An electronic system comprising:

an input device;

an output device;

a processor device coupled to the input and output devices; and a memory device coupled to the processor device, the memory device comprising:

a plurality of memory cells;

peripheral circuitry coupled to the memory cells and operative in response to receiving a supply voltage in both a normal mode and a test mode of the memory device;

a plurality of bitlines coupled to the memory cells; and switching circuitry coupled to the bitlines for selectively outputting a normal bitline voltage thereto in the normal mode of the memory device and for selectively outputting an analog test mode bitline voltage thereto that is different than the normal bitline voltage and the supply voltage in the test mode of the memory device while the peripheral circuitry receives the supply voltage.

14. A method of testing a semiconductor memory device by modulating bitline voltages in the memory device, the method comprising:

causing the memory device to enter a test mode; and when the memory device is in the test mode, applying a low analog test mode bitline voltage to bitlines of the memory device that are under test; and operating peripheral circuitry in the memory device using a supply voltage that is greater than the low test mode bitline voltage.

15. The method of claim 14 wherein the steps of causing, applying, and operating occur during at least one of probe testing and functional testing of the memory device.

16. The method of claim 14 wherein the step of causing the memory device to enter the test mode comprises outputting an active test mode enable signal.

17. The method of claim 14 wherein the step of applying the analog test mode bitline voltage to the bitlines of the memory device comprises applying a predetermined low analog test mode bitline voltage to the bitlines.

18. The method of claim 14 wherein the step of applying the analog test mode bitline voltage to the bitlines of the memory device comprises incrementally applying a variety of different low analog test mode bitline voltages to the bitlines.

19. The method of claim 14 further comprising discarding the memory device when any memory cells therein change state in response to the test mode bitline voltage being applied to the bitlines.

* * * * *